(12) United States Patent
Nakamata

(10) Patent No.: US 11,462,450 B2
(45) Date of Patent: Oct. 4, 2022

(54) SEMICONDUCTOR DEVICE

(71) Applicant: FUJI ELECTRIC CO., LTD., Kawasaki (JP)

(72) Inventor: Yuko Nakamata, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 96 days.

(21) Appl. No.: 17/158,194

(22) Filed: Jan. 26, 2021

(65) Prior Publication Data
US 2021/0296190 A1 Sep. 23, 2021

(30) Foreign Application Priority Data

Mar. 18, 2020 (JP) .............................. JP2020-048029

(51) Int. Cl.
*H01L 23/29* (2006.01)
*H01L 23/31* (2006.01)
*H01L 23/42* (2006.01)

(52) U.S. Cl.
CPC ........ *H01L 23/295* (2013.01); *H01L 23/3135* (2013.01); *H01L 23/42* (2013.01); *H01L 2924/181* (2013.01)

(58) Field of Classification Search
CPC .... H01L 23/3135; H01L 23/295; H01L 23/42
See application file for complete search history.

(56) References Cited

U.S. PATENT DOCUMENTS 7,723,162 B2 * 5/2010 Anderson ............. H01L 23/573
438/126
7,906,860 B2 * 3/2011 Meyer .................... H01L 24/19
438/126

(Continued)

FOREIGN PATENT DOCUMENTS

JP 200632617 A 2/2006

*Primary Examiner* — Mark W Tornow
*Assistant Examiner* — Abbigale A Boyle

(57) ABSTRACT

A semiconductor device in which a semiconductor element mounted on a laminate substrate and an electrically conductive connection member are sealed with a sealing material, includes: a primer layer in an interface between the sealing material and sealed members including the laminate substrate, the semiconductor element, and the electrically conductive connection member, in which the sealing material includes a first sealing layer which is provided in contact with the primer layer; and a second sealing layer which covers the first sealing layer, the semiconductor device satisfies $\alpha_p \geq \alpha_1 > \alpha_2$ in which $\alpha_p$, $\alpha_1$, and $\alpha_2$ represent coefficients of linear thermal expansion of the primer layer, the first sealing layer, and the second sealing layer, respectively, $\alpha_c \geq 15 \times 10^{-6}/°$ C. in which $\alpha_c$ represents a composite coefficient of linear thermal expansion of the sealing layers, and $E_c \geq 5$ GPa or more in which $E_c$ represents a composite Young's modulus of the sealing layers.

8 Claims, 1 Drawing Sheet

(56) References Cited

U.S. PATENT DOCUMENTS

| | | | |
|---|---|---|---|
| 8,507,080 B2* | 8/2013 | Mahler | B32B 7/12 |
| | | | 428/312.8 |
| 9,165,849 B2* | 10/2015 | Hatanaka | H03H 9/1085 |
| 9,515,057 B2* | 12/2016 | Ma | H01L 25/105 |
| 9,842,811 B1* | 12/2017 | Chou | H01L 24/48 |
| 10,014,260 B2* | 7/2018 | Tsai | H01L 21/6835 |
| 10,475,775 B2* | 11/2019 | Fang | H01L 23/5384 |
| 11,004,761 B2* | 5/2021 | Sakamoto | H01L 23/12 |
| 11,114,315 B2* | 9/2021 | Chew | H01L 21/568 |
| 2007/0262426 A1* | 11/2007 | Mahler | C08G 18/72 |
| | | | 257/E23.056 |
| 2017/0278771 A1* | 9/2017 | Kanai | H01L 24/83 |
| 2018/0247834 A1* | 8/2018 | Tsuda | H01L 23/295 |

* cited by examiner

SEMICONDUCTOR DEVICE

CROSS-REFERENCE TO RELATED APPLICATION

This application claims priority from Japanese Patent Application No. 2020-048029 filed on Mar. 18, 2020, which is incorporated herein by reference in its entirety.

BACKGROUND OF THE INVENTION

Field of the Invention

The present invention relates to a semiconductor device. The present invention particularly relates to a highly reliable semiconductor device with a longer service life.

Description of Related Art

Power semiconductor modules are widely used in fields in which efficient power conversion is required. For example, their application has been expanding to the field of power electronics such as industrial equipment, electric vehicles, and home appliances. These power semiconductor modules incorporate switching elements and diodes, and Si (silicon) semiconductors and SiC (silicon carbide) semiconductors are used for the elements.

A power semiconductor module is manufactured by sealing a chip which is formed of a semiconductor element and electrically conductive connection members such as a lead frame which are connected to the chip with an electrically insulating resin sealing material. The resin sealing material contains a thermosetting resin and an inorganic filler as main components. The coefficients of linear expansion of the resins themselves are larger than the coefficients of linear expansion of metal members such as the lead frame. Hence, when the semiconductor module undergoes heat cycles or the like, a high thermal stress is generated in the semiconductor module.

A semiconductor module in which a soft covering resin layer of a polyimide or the like is provided on a surface of a casing member which contains a chip formed of a semiconductor element and a wire connected onto the chip, and the casing member is filled with a hard sealing resin such as an epoxy resin on the soft covering resin layer has been known (see Patent Document 1). Patent Document 1 discloses that it is possible to provide a long-life power semiconductor module that is superior in humidity-cycling resistance and moisture resistance by combining a soft covering resin and a sealing resin having certain physical properties.

REFERENCE DOCUMENT LIST

Patent Document
  Patent Document 1: JP 2006-32617 A

SUMMARY OF THE INVENTION

However, in the sealing structure of the conventional power semiconductor module, there is a problem in that repetitive application of thermal stress causes peeling between the sealing material and the sealed members such as the lead frame, cause cracking in the sealing material itself. Further absorption of moisture with time degrades the covering resin layer, lowering the adhesion between the sealing material and the sealed members, so that the service life of the power semiconductor module decreases (the Tj power-cycling capability decreases). More specifically, it was revealed that in the technique of Patent Document 1, peeling occurs on an interface between the lead frame on the chip and the covering resin layer due to absorption of moisture, so that the Tj power-cycling capability decreases.

The present inventors studied, in a sealing structure including a primer layer of a polyimide, a polyamide, or the like, to reduce the stress applied to the interface between the primer layer and an electrically conductive connection member by changing the physical property values of a sealing material stacked on the primer layer. It is possible to reduce the interface stress by reducing the content of an inorganic filler which is normally contained in a sealing material to bring the physical property values of the sealing material closer to the physical property values of the primer layer. This makes it possible to secure the adhesion between the sealed member, on which the primer layer is provided, and the primer layer to suppress the decrease in power-cycling capability. On the other hand, there is a risk that reducing the content of the inorganic filler in the sealing material will reduce the strength of the sealing material, leading to cracking of the sealing material. For example, in the case in which the content of the inorganic filler is approximately 70 to 75% by mass relative to the mass of the entire sealing material, the initial strength is also high, so that the degree of decrease in strength is small even after absorption of moisture. However, if the content of the inorganic filler is less than 70%, the initial strength is low, and also the degree of decrease is large after absorption of moisture.

As a result of earnest studies, the present inventors found that by employing a sealing structure including at least two layers of resins having different compositions and having specific physical properties, it is possible to achieve a better balance between a reduction in interface stress and a high strength, which has been impossible for a single-layer resin sealing structure, and completed the present invention.

Specifically, according to one embodiment, the present invention relates to a semiconductor device comprising:
  a laminate substrate;
  a semiconductor element mounted on the laminate substrate;
  an electrically conductive connection member;
  a sealing material with which the semiconductor element and the electrically conductive connection member are sealed; and
  a primer layer in an interface between the sealing material and sealed members including the laminate substrate, the semiconductor element, and the electrically conductive connection member, wherein
    the sealing material includes: a first sealing layer which is provided in contact with the primer layer; and a second sealing layer which covers the first sealing layer,
    the semiconductor device satisfies $$\alpha_p \geq \alpha_1 > \alpha_2,$$

wherein $\alpha_p$ represents a coefficient of linear thermal expansion of the primer layer, $\alpha_1$ represents a coefficient of linear thermal expansion of the first sealing layer, and $\alpha_2$ represents a coefficient of linear thermal expansion of the second sealing layer, $$\alpha_c \geq 15 \times 10^{-6}/°C.,$$

wherein $\alpha_c$ represents a composite coefficient of linear thermal expansion of the first sealing layer and the second sealing layer, $$E_c \geq 5 \text{ GPa or more},$$

wherein $E_c$ represents a composite Young's modulus of the first sealing layer and the second sealing layer, and $\alpha_c$ and $E_c$ are defined by the following formulae:

$$\alpha_c = (\alpha_1 E_1 V_1 + \alpha_2 E_2(1-V_1))/(E_1 V_1 + E_2(1-V_1)), \text{ and}$$

$$E_c = E_1 V_1 + E_2(1-V_1),$$

wherein $E_1$ represents a Young's modulus of the first sealing layer, $E_2$ represents a Young's modulus of the second sealing layer, and $V_1$ represents a volume fraction of the first sealing layer in a total volume of a sealing material portion stacked on a predetermined interface region including the primer layer ($0<V_1<1$).

In the semiconductor device, it is preferable that the coefficient of linear thermal expansion $\alpha_1$ of the first sealing layer and the coefficient of linear thermal expansion $\alpha_2$ of the second sealing layer satisfy $100 \geq \alpha_1 > \alpha_2 \geq 10$.

In the semiconductor device, it is preferable that $V_1$ is 0.4 to 0.8 in a sealing material portion stacked on an interface region on an upper portion of the semiconductor element.

In the semiconductor device, it is preferable that the first sealing layer include a thermosetting resin base material and an inorganic filler, the second sealing layer include a thermosetting resin base material and an inorganic filler, and a content of the inorganic filler in the first sealing layer be smaller than a content of the inorganic filler in the second sealing layer.

In the semiconductor device, it is preferable that content of the inorganic filler in the first sealing layer be smaller than content of the inorganic filler in the second sealing layer, the content of the inorganic filler in the first sealing layer be selected from a range of 14 to 68% by mass, and the content of the inorganic filler in the second sealing layer be selected from a range of 68 to 85% by mass.

In the semiconductor device, it is preferable that the thermosetting resin base material contained in the first sealing layer and the thermosetting resin base material contained in the second sealing layer be each an epoxy resin.

In the semiconductor device, it is preferable that the first sealing layer and/or the second sealing layer further contain a curing agent, and the curing agent be an acid anhydride-based curing agent.

In the semiconductor device, it is preferable that the primer layer be selected from a polyamide resin, a polyimide resin, and a polyamide-imide resin.

According to the present invention, it is possible to provide a highly reliable semiconductor device in which peeling on an interface between a primer layer and a sealing material is suppressed.

DESCRIPTION OF PREFERRED
EMBODIMENTS

Hereinafter, embodiments of the present invention will be described with reference to the drawings. However, the present invention is not limited to the embodiments described below.

According to one embodiment, the present invention relates to a semiconductor device. The semiconductor device according to this embodiment is a semiconductor device formed by connecting a semiconductor element mounted on a laminate substrate to an output terminal with an electrically conductive connection member and sealing the semiconductor element and the output terminal with a sealing material, the semiconductor device comprising: a primer layer in an interface between the sealing material and sealed members including the semiconductor element and the electrically conductive connection member, wherein the sealing material includes a first sealing layer and a second sealing layer.

Figure 1:
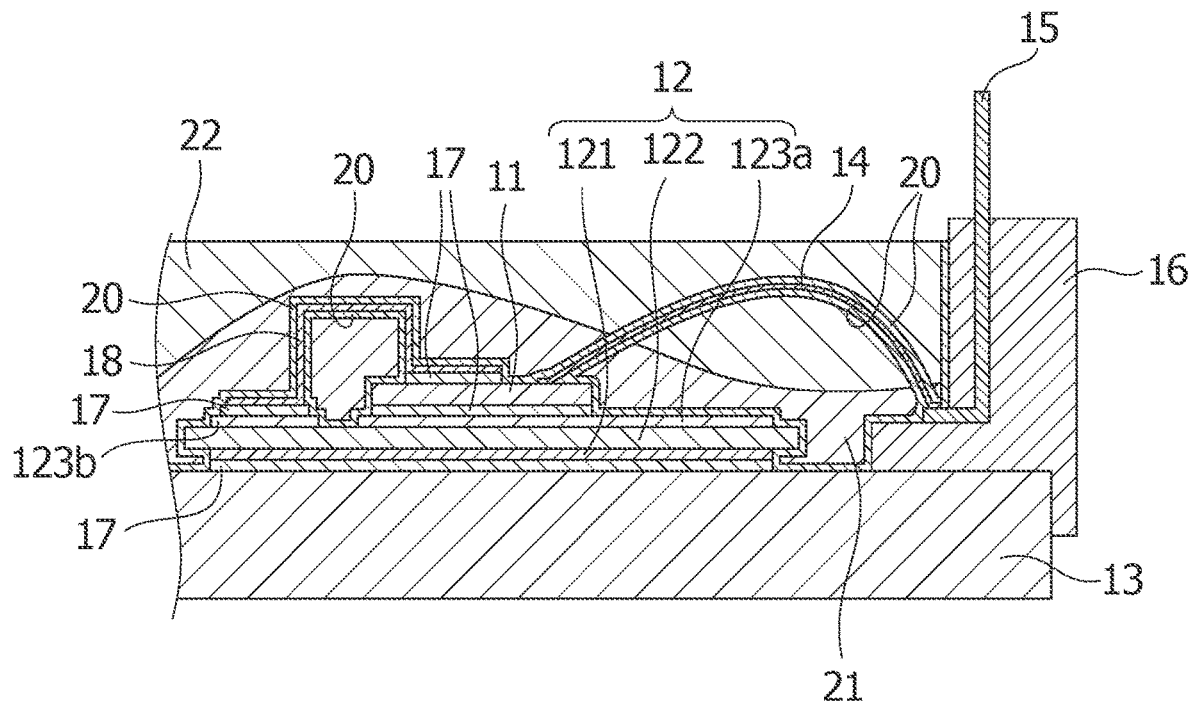
FIG. 1 is a conceptual cross-sectional view showing a cross-sectional structure of a semiconductor device according to the present invention.

FIG. 1 shows a conceptual cross-sectional view of a power module which is an example of the semiconductor device according to this embodiment. The power module shown has a stacked structure in which a semiconductor element 11 and a laminate substrate 12 are joined onto a heat dissipation plate 13 by means of a solder joint layer 17. To the heat dissipation plate 13, a case 16 which incorporates an external terminal 15 is bonded. Electrodes of the semiconductor element 11 and the laminate substrate 12 are connected by a lead frame 18, which is an electrically conductive connection member, and the semiconductor element 11 and the external terminal 15 are connected by an aluminum wire 14. A primer layer 20 is stacked on sealed members such as the semiconductor element 11, the laminate substrate 12, the lead frame 18, and the aluminum wire 14, which is an electrically conductive connection member. In addition, the case 16 is filled with a first sealing layer 21 in contact with the primer layer 20. Moreover, the case 16 is filled with a second sealing layer 22 in contact with the first sealing layer 21. Note that although the lead frame and the aluminum wire are shown as the electrically conductive connection members, the present invention is not limited to these.

The semiconductor element 11 is a power chip such as an insulated gate bipolar transistor (IGBT) or a diode chip and any of various Si devices, SiC devices, GaN devices, and the like may be used. In addition, these devices may be used in combination. For example, a hybrid module using Si-IGBT and SiC-SBD, or the like may be used. The number of semiconductor elements to be mounted may be one or a plurality of semiconductor elements may be mounted.

The laminate substrate 12 can be configured with an insulating substrate 122, a first electrically conductive plate 121 formed on one main surface of the insulating substrate 122, and second electrically conductive plates 123a and 123b formed on the other main surface of the insulating substrate 122. For the insulating substrate 122, a material with superior electrical insulation property and thermal conductivity may be used. The material of the insulating substrate 122 includes, for example, $Al_2O_3$, AlN, SiN, or the like. For high-pressure resistant application in particular, a material that achieves both of good electrical insulation property and thermal conductivity is preferable, and AlN or SiN may be used, but the present invention is not limited to these. For the first electrically conductive plate 121 and the second electrically conductive plates 123a and 123b, a metal material that is superior in processability such as Cu or Al may be used. Among the electrically conductive plates formed of Cu or the like, the electrically conductive plate that is not in contact with the semiconductor element is sometimes referred to as a back copper foil or a back electrically conductive plate. In addition, for the purpose of rust prevention and the like, the electrically conductive plate may be formed of Cu or Al that has been subjected to processing such as Ni plating. The method for disposing the electrically conductive plates 121, 123a, and 123b on the insulating substrate 122 may be a direct copper bonding method or an active metal brazing method. In the illustrated embodiment, two second electrically conductive plates 123a and 123b are provided on the insulating substrate 122 in a non-continuous manner. One of the second electrically conductive plates 123a functions as an electrode joined to the semiconductor element 11 while the other 123b functions as an electrode connected to the lead frame 18.

The lead frame 18 is an electrically conductive connection member which connects the semiconductor element 11, the second electrically conductive plate 123b, and the like. Specifically, the lead frame 18 is joined to the electrode (front electrode) of the semiconductor element 11 by a joint layer of a solder material or the like. In addition, the lead frame 18 is joined to interconnection portions such as the second electrically conductive plate 123b by the joint layer 17 of the solder material or the like. The lead frame 18 may be formed of a metal such as copper or an alloy containing copper. On the surface of the lead frame 18, an Ni or Ni alloy layer or a Cr or Cr alloy layer may be formed by a plating method or the like. In this case, the film thickness of the Ni or Ni alloy layer or the Cr or Cr alloy layer may be approximately 20 μm or less. Note that the coefficients of linear expansion of Ni, Cr, and their alloys are from 13 to $17 \times 10^{-6}/°C$ which are substantially similar to the coefficient of linear expansion of Cu, and have only a small effect on the thermal stress within the above-described range of the film thickness.

For the heat dissipation plate 13, a metal that is superior in thermal conductivity, such as copper or aluminum, is used. In addition, the heat dissipation plate 13 may be covered with Ni and Ni alloy for corrosion prevention.

The joint layer 17 may be formed by using a lead-free solder. For example, an Sn—Ag—Cu-based solder, an Sn—Sb-based solder, an Sn—Sb—Ag-based solder, an Sn—Cu-based solder, an Sn—Sb—Ag—Cu-based solder, an Sn—Cu—Ni-based solder, an Sn—Ag-based solder, or the like may be used, but the solder material is not limited to these. In addition, the joint layer may be formed by using a connecting material containing minute metal particles such as sintered silver nanoparticles.

The case 16 may be formed of a thermoplastic resin such as polyphenylene sulfide (PPS) and polybutylene terephthalate (PBT).

In this embodiment, members including the semiconductor element 11, the laminate substrate 12, as well as the electrically conductive connection members such as the lead frame 18 and the aluminum wire 14 are also referred to as sealed members. On the sealed members, the primer layer 20 is formed. The primer layer 20 may be a layer formed of a resin containing a polyamide, a polyimide, or a polyamide-imide. The primer layer 20 can improve the adhesion of the interface between the sealed member and the sealing material. The thickness of the primer layer 20 is not particularly limited as long as the thickness can give adhesion. The thickness of the primer layer may be, for example approximately 1 to 15 μm, and preferably 5 to 12 μm. Since the primer layer also has an effect of stress relaxation, the above-described range is more preferable because it is possible to improve the adhesion. The primer layer 20 may be provided to cover the entire surface of the semiconductor element 11, the laminate substrate 12, the lead frame 18, and the aluminum wire 14. In addition, the primer layer may be formed by a method such as a spray coating method, an immersion method, or application with a dispenser.

In the case 16, the sealing material is disposed on the primer layer 20. The sealing material insulates and seals members including the semiconductor element 11, the laminate substrate 12, the aluminum wire 14, the external terminal 15, and the lead frame 18. Hence, it can be said that the primer layer is provided on the interface between the sealing material and the sealed members including the semiconductor element 11, the laminate substrate 12, as well as the electrically conductive connection members such as the lead frame 18 and the aluminum wire 14. The sealing material includes at least the first sealing layer 21 and the second sealing layer 22.

The first sealing layer 21 is provided in contact with the primer layer 20, and mainly covers the surrounding of the semiconductor element 11, the laminate substrate 12, the electrically conductive connection members, and the like. The second sealing layer 22 is provided on the first sealing layer 21 in such a manner as to cover the first sealing layer 21. In general, the second sealing layer 22 is in contact with the first sealing layer 21, but is not in contact with the primer layer 20. Then, as in the mode shown, in the embodiment in which the sealing material is disposed in the case, the second sealing layer 22 may form the surface that comes into contact with the atmosphere. In a certain embodiment, one or more additional sealing layers may be formed on the second sealing layer 22. In a case in which a sealing layer having a larger coefficient of thermal expansion α than that of the second sealing layer is stacked on the second sealing layer 22, it is sometimes possible to improve the strength of the sealing material without affecting the stress to be generated on the interface between the primer layer 20 and the electrically conductive connection members.

The first sealing layer 21 and the second sealing layer 22 further satisfy relational formulae of physical properties represented by the following formulae (1), (2), and (3):

$$\alpha_p \geq \alpha_1 > \alpha_2 \tag{1}$$

wherein $\alpha_p$ represents the coefficient of linear thermal expansion of the primer layer 20, $\alpha_1$ represents the coefficient of linear thermal expansion of the first sealing layer 21, and $\alpha_2$ represents the coefficient of linear thermal expansion of the second sealing layer 22, and $$\alpha_c \geq 15 \times 10^{-6}/°C. \tag{2}$$

wherein $\alpha_c$ represents the composite coefficient of linear thermal expansion of the first sealing layer 21 and the second sealing layer 22, and $$E_c \geq 5 \text{ GPa} \tag{3}$$

wherein $E_c$ represents the composite Young's modulus of the first sealing layer 21 and the second sealing layer 22, from the results of experiments.

The coefficient of linear expansion $\alpha_p$ of a primer formed of a resin containing a polyamide, a polyimide, or a polyamide-imide is generally 40 to $100 \times 10^{-6}/°C$. In addition, for electrically conductive plates of a lead frame and a laminate substrate, which are sealed members, copper or a copper alloy is mainly used, and the coefficients of linear expansion of these are generally 15 to $17 \times 10^{-6}/°C$. The lower limit value of the formula (2) is comparable with the coefficients of linear expansion of copper and a copper alloy, which are materials for the electrically conductive connection members such as the lead frame 18 and the electrically conductive plates 121, 123a and 123b of the laminate substrate 12, on which the primer layer 20 is formed.

The composite coefficient of linear thermal expansion $\alpha_c$ is represented by the following formula (4) in accordance with the rule of mixture of coefficients of linear thermal expansion (Turner, P. S. J., Research of the National Bureau of Standards, 36, 239 1946):

the composite coefficient of linear thermal expansion
$$\alpha_c=(\alpha_1 E_1 V_1+\alpha_2 E_2(1-V_1))/(E_1 V_1+E_2(1-V_1)) \quad (4)$$

wherein $\alpha_1$ and $\alpha_2$ are as described above, $E_1$ represents the Young's modulus of the first sealing layer 21, $E_2$ represents the Young's modulus of the second sealing layer 22, and $V_1$ represents the volume content of the first sealing layer 21 in the sealing material formed of the first sealing layer 21 and the second sealing layer 22, which satisfies $0<V_1<1$. Note that $V_1+V_2=1$ and $0<V_2<1$, wherein $V_2$ represents the volume content of the second sealing layer 22.

The composite Young's modulus $E_c$ is represented by the following formula (5) in accordance with the rule of mixture of the Young's modulus (An Introduction to Composite Dynamics/Journal of the Japan Society for Composite Materials 22, 1 (1996) 19-25):

The composite Young's modulus $E_c=E_1 V_1+E_2(1-V_1) \quad (5)$ wherein the definitions of the respective signs are the same as those described above.

It is preferable that the coefficient of linear thermal expansion $\alpha_1$ of the first sealing layer and the coefficient of linear thermal expansion $\alpha_2$ of the second sealing layer further satisfy the numerical value range represented by the following formula (6):

$$100 \geq \alpha_1 > \alpha_2 \geq 10 \quad (6).$$

When the coefficients of linear thermal expansion satisfy the values in the range, it is possible to more securely reduce the stress on the interface between the primer layer 20 and the first sealing layer 21. The composite coefficient of linear thermal expansion $\alpha_c$ is preferably $20\times10^{-6}/°$ C. or more, and the composite Young's modulus $E_c$ is preferably 7 GPa or more. If the composite coefficient of linear thermal expansion $\alpha_c$ and the composite Young's modulus $E_c$ have the values within these ranges, it is expected to achieve a more favorable result in achieving a better balance between the reduction in stress and the crack prevention of the sealing material.

In the present invention, with the intention to impart trade-off properties, that is, the reduction in stress in the interface with the primer layer 20 and the crack prevention (strength securement) to the sealing material, the first sealing layer 21 and the second sealing layer 22 having different compositions are provided to obtain a desired power-cycling capability in a power module. Specifically, it was found important not only to satisfy the formula (1), which means that the coefficients of linear expansion of the respective layers to be stacked are changed stepwise, but also to satisfy the composite coefficient of linear expansion (formula (1)) and the composite Young's modulus (formula (2)), which are an overall coefficient of linear expansion and Young's modulus of the first sealing layer 21 and the second sealing layer 22. By satisfying all the formulae (1), (2), and (3), it is possible to obtain a semiconductor module in which thermal stress between the sealing layer and the sealed members such as the lead frame is reduced and cracking of the sealing material does not occur. If a material having as large a coefficient of linear expansion as that of the primer is used as the sealing material, although the thermal stress is small, the rigidity is low. That is, if the composite Young's modulus is low, the sealing layer itself cracks when deformation occurs due to the thermal stress. Hence, a composite Young's modulus that satisfies the formula (3) is necessary.

In designing the first sealing layer 21 and the second sealing layer 22 that satisfy all the formulae (1), (2), and (3), the volume fraction $V_1$ of the first sealing layer 21, which is one of the parameters to determine the composite coefficient of linear thermal expansion $\alpha_c$ and the composite Young's modulus $E_c$ may be the volume ratio of the first sealing layer 21 and the second sealing layer 22 in a sealing material portion stacked on a predetermined interface region between the primer layer 20 and the first sealing layer 21. The volume of the sealing material portion stacked on the predetermined interface region takes a value obtained by multiplying the area of the interface region by the layer thickness of the sealing material.

The predetermined interface region may be the entire interface region on which the first sealing layer 21 is stacked. In this case, the volume fraction $V_1$ of the first sealing layer 21 is equal to the volume fraction of the first sealing layer 21 in the entire sealing material. Note that the interface region in this case may be the formation region of the primer layer 20 except the inner surface of the case in a plan view in which the semiconductor device is viewed in a direction perpendicular to the laminate substrate from the surface side of the laminate substrate in which the semiconductor element is placed. The area of the interface region in this case may be the projection area obtained by projecting the formation region of the primer layer 20 onto a plane in the same direction.

In the case in which the volume fraction $V_1$ is not the volume fraction of the first sealing layer 21 in the entire sealing material, the predetermined interface region may be, for example, the interface region between the primer layer and the first sealing layer 21, that corresponds to a joint section between the lead frame 18 and the semiconductor element 11. In this interface region, the primer layer 20 is particularly likely to peel due to thermal stress, and it is thus possible to enhance the reliability of the entire semiconductor device by reducing the interface stress in this region. In the embodiment shown, the lead frame 18 is a member that connects the electrode portion of the semiconductor element 11 and the electrically conductive plate 123b serving as a terminal block, and includes: an element connection portion which has a surface connected to the electrode portion of the semiconductor element 11; an upright portion which is formed in a shape being bent from the element connection portion and protruding upward; and an interconnection portion which is bent from the upright portion, extends toward the terminal block and has a surface connected to the terminal block. On the surface of the element connection portion that is not in contact with the element, the primer layer is formed. On the upper portion of the primer layer in the vertical direction, the first sealing layer and the second sealing layer are stacked. When S represents the joint area between the element electrode and the lead frame in the element connection portion, the volume $v_i$ of the first sealing layer present above the element connection portion in the vertical direction takes a value obtained by multiplying S by the thickness of the first sealing layer, and the volume $v_{ii}$ of the second sealing layer takes a value obtained by multiplying S by the thickness of the second sealing layer. Here, $V_1$ and $V_2$ in the formulae (2) and (3) can be expressed by the following formulae (7) and (8):

$$V_1=v_i/(v_i+v_{ii}) \quad (7)$$

$$V_2=v_{ii}/(v_i+v_{ii}) \quad (8)$$

The predetermined interface region may also be a primer layer formation region (including the joint section between the lead frame 18 and the semiconductor element 11) on the entire upper surface of the semiconductor element. The sealing material portion stacked on the upper portion of the primer layer formation region on the upper surface of the semiconductor element refers to a sealing material portion present in a portion overlapping the semiconductor element in a plan view in which the semiconductor device is viewed in the direction perpendicular to the laminate substrate from the surface side of the laminate substrate in which the semiconductor element is placed. The area of the interface region in this case may be the area of the main surface of the semiconductor element 11. In a certain embodiment, $V_1$ in this portion may be calculated in the same manner as that in the abovementioned formulae (7) and (8) to design the compositions of the first sealing layer and the second sealing layer that satisfy the formulae (1) to (3). The upper surface of the semiconductor element is also a region in which the primer layer 20 is likely to peel due to thermal stress, and it is thus possible to obtain the same effects as those described above by reducing the interface stress in this region.

Furthermore, the predetermined interface region may be a primer layer formation region (including the upper surface of the semiconductor element) on the entire upper surfaces of the electrically conductive plates 123a and 123b. The sealing material portion stacked on the upper portion of the primer layer formation region on the upper surface of the electrically conductive plates 123a and 123b refers to a sealing material portion present in a portion overlapping the region defined by the outer edges of the electrically conductive plates 123a and 123b in a plan view in which the semiconductor device is viewed in the direction perpendicular to the laminate substrate. The area of the interface region in this case may be the area of the main surfaces of the electrically conductive plates 123a and 123b. In a certain embodiment, $V_1$ in this portion may be calculated in the same manner as that in the abovementioned formulae (7) and (8) to design the compositions of the first sealing layer and the second sealing layer that satisfy the formulae (1) to (3).

Here, the coefficient of linear thermal expansion $\alpha_1$ and the Young's modulus $E_1$ of the first sealing layer 21 alone as well as the coefficient of linear thermal expansion $\alpha_2$ and the Young's modulus $E_2$ of the second sealing layer 22 alone are determined by the composition of components forming each sealing layer. Each of the first sealing layer 21 and the second sealing layer 22 preferably contains a thermosetting resin base material and an inorganic filler, and may be a cured thermosetting resin product obtained by curing a thermosetting resin composition which may optionally contain a curing agent, a curing accelerator, or an additive. Hereinafter, thermosetting resin base materials, inorganic fillers, curing agents, curing accelerators, and additives usable in common for the first sealing layer 21 and the second sealing layer 22 and properties that the components contained in each of the first sealing layer 21 and the second sealing layer 22 have to satisfy will be described.

The thermosetting resin base material is not particularly limited, and includes, for example, epoxy resins, phenolic resins, maleimide resins, and the like. Among these, an epoxy resin having at least two or more epoxy groups in one molecule is particularly preferable because such an epoxy resin have high dimensional stability, water resistance, chemical resistance, and electrical insulation property. Specifically, an aliphatic epoxy resin, an alicyclic epoxy resin, or a mixture of these is preferably used.

The aliphatic epoxy resin refers to an epoxy compound in which a carbon atom to which an epoxy group is directly bonded is a carbon atom that is included in an aliphatic hydrocarbon. Hence, even a compound that contains an aromatic ring in the main skeleton is classified into the aliphatic epoxy resin if the compound satisfies the above condition. The aliphatic epoxy resin includes bisphenol A-type epoxy resins, bisphenol F-type epoxy resins, bisphenol AD-type epoxy resins, biphenyl-type epoxy resins, naphthalene-type epoxy resins, cresol novolac-type epoxy resins, polyfunctional epoxy resins having three or more functions, and the like, but is not limited to these. One of these may be used alone, or two or more of these may be mixed and used. In addition, naphthalene type epoxy resins and polyfunctional epoxy resins having three or more functions are also referred to as high heat resistance epoxy resins because of their high glass transition temperatures. It is possible to improve the heat resistance by adding these high heat resistance epoxy resin.

The alicyclic epoxy resin refers to an epoxy compound in which two carbon atoms that are included in an epoxy group form an alicyclic compound. The alicyclic epoxy resin includes monofunctional epoxy resins, bifunctional epoxy resin, polyfunctional epoxy resins having three or more functions, and the like, but is not limited to these. One of these alicyclic epoxy resins may be used alone or two or more different alicyclic epoxy resins may be mixed and used. Note that since mixing an alicyclic epoxy resin with acid anhydride curing agent and curing the mixture increases the glass transition temperature, it is possible to enhance the heat resistance by mixing an alicyclic epoxy resin with an aliphatic epoxy resin for use.

The thermosetting resin base material used for the compositions in this embodiment may be obtained by mixing the abovementioned aliphatic epoxy resin and alicyclic epoxy resin. The mixing ratio in the case of mixing may be determined as desired. The mass ratio of an aliphatic epoxy resin and an alicyclic epoxy resin may be approximately 2:8 to 8:2, or may be approximately 3:7 to 7:3, and is not limited to a specific mass ratio.

The thermosetting resin base material contained in the first sealing layer and the thermosetting resin base material contained in the second sealing layer may be the same compound or may be different compounds. It is preferable that the thermosetting resin base material contained in the first sealing layer and the thermosetting resin base material contained in the second sealing layer be the same, and the mass ratio of a bisphenol A-type epoxy resin and an alicyclic epoxy resin in each thermosetting resin base material be 1:1 to 1:4.

The inorganic filler may be a metal oxide or a metal nitride, includes, for example, fused silica, silica (silicon oxide), alumina, aluminum hydroxide, titania, zirconia, aluminum nitride, talc, clay, mica, glass fiber, and the like, but is not limited to these. These inorganic fillers make it possible to enhance the thermal conductivity of the cured product (sealing layer) and reduce the coefficient of thermal expansion. One of these inorganic fillers may be used alone, or two or more of them may be mixed and used. These inorganic fillers may be microfillers or may be nanofillers. Two or more inorganic fillers having different particle sizes and/or types may be mixed and used. In particular, it is preferable to use an inorganic filler having an average particle size of approximately 0.2 to 20 μm.

The inorganic filler contained in the first sealing layer 21 and the inorganic filler contained in the second sealing layer 22 may be the same compound or may be different compounds. The average particle size of the inorganic filler contained in the first sealing layer 21 and the average particle size of the inorganic filler contained in the second sealing layer 22 may be the same or may be different. In a certain aspect, the inorganic filler contained in the first sealing layer 21 and the inorganic filler contained in the second sealing layer 22 may be the same compound and have the same average particle size. The coefficient of linear thermal expansion and the Young's modulus of the sealing layer alone varies depending on the material and content of the inorganic filler. Hence, in general, it is possible to obtain desired coefficient of linear thermal expansion and Young's modulus for each sealing layer alone by determining the specifications of the inorganic fillers in the first sealing layer 21 and the second sealing layer 22, in particular the contents of the inorganic fillers. It is preferable that the inorganic filler contained in the first sealing layer 21 and the inorganic filler contained in the second sealing layer 22 be the same because it is possible to adjust the coefficient of linear thermal expansion and the Young's modulus by adjusting the contents in this case.

The content of the inorganic filler in each of the first sealing layer 21 and the second sealing layer 22 only has to be a content that allows the above-given predetermined coefficient of linear thermal expansion and Young's modulus to be achieved. In a certain embodiment, it is possible to achieve the coefficient of linear thermal expansion α and the Young's modulus E of each sealing layer alone by differentiating the contents of the inorganic filler while using the same types of the thermosetting resin base material, the curing agent, as well as optionally, the curing agent and the curing accelerator included in the first sealing layer 21 and the second sealing layer 22. In this case, it is possible to obtain a relational formula between the coefficient of linear thermal expansion or the Young's modulus of a cured product and the content of an inorganic filler by mixing a desired thermosetting resin, as well as optionally, a curing agent and a curing accelerator with the inorganic filler in various contents to obtain cured products, and experimentally measuring the coefficient of linear thermal expansion or the Young's modulus of the cured products to create a calibration curve. Based on the relational formula obtained from the calibration curve, it is possible to derive the content of the inorganic filler that imparts the desired coefficient of linear thermal expansion α and Young's modulus E for each sealing layer alone. Alternatively, it is possible to derive the content of the inorganic filler that imparts the desired coefficient of linear thermal expansion α and Young's modulus E similarly for the resin composition included in each sealing layer even when the types of the thermosetting resin base material, the curing agent, as well as optionally, the curing agent and the curing accelerator included in the first sealing layer 21 and the second sealing layer 22 are different from each other.

The values of the coefficient of linear thermal expansion $\alpha_1$ and the Young's modulus $E_1$ that the first sealing layer 21 should satisfy and the coefficient of linear thermal expansion $\alpha_2$ and the Young's modulus $E_2$ that the second sealing layer 22 should satisfy can be selected to satisfy the above relational formulae (1) to (3). Hence, it is possible to determine the compositions of the first sealing layer 21 and the second sealing layer 22. In general, the content of the inorganic filler in the first sealing layer 21 is smaller than the content of the inorganic filler in the second sealing layer 22. The content mentioned herein refers to the proportion that the inorganic filler accounts for in each sealing layer when the mass of the thermosetting resin composition included in each sealing layer is deemed as 100%. In an embodiment in which the inorganic filler of the first sealing layer and the inorganic filler of the second sealing layer are formed of the same silicon oxide compound, the content of the inorganic filler in the first sealing layer 21 is smaller than the content of the inorganic filler in the second sealing layer 22, the content of the inorganic filler in the first sealing layer 21 is selected from a range of 14 to 68% by mass, and the content of the inorganic filler in the second sealing layer 22 is selected from a range of 68 to 85% by mass.

The thermosetting resin composition of this embodiment may contain a curing agent as an optional component. The curing agent is not particularly limited as long as the curing agent can react with a thermosetting resin base material, preferably an epoxy resin base material to be cured; however, it is preferable to use an acid anhydride-based curing agent. The acid anhydride-based curing agent includes, for example, aromatic acid anhydrides, specifically phthalic anhydride, pyromellitic anhydride, trimellitic anhydride, and the like. Alternatively, the acid anhydride-based curing agent includes cycloaliphatic anhydrides, specifically tetrahydrophthalic anhydride, methyltetrahydrophthalic anhydride, hexahydrophthalic anhydride, methylhexahydrophthalic anhydride, methylnadic anhydride, and the like, or aliphatic acid anhydrides, specifically succinic anhydride, poly(adipic anhydride), poly(sebacic anhydride), poly(azelaic anhydride), and the like. The amount of the curing agent blended is preferably approximately 50 parts by mass or more and 170 parts by mass or less, and more preferably approximately 80 parts by mass or more and 150 parts by mass or less, relative to 100 parts by mass of the epoxy resin base material. If the amount of the curing agent blended is less than 50 parts by mass, the glass transition temperature may decrease due to the lack of cross-linkage in some cases. If the amount of the curing agent blended is more than 170 parts by mass, the moisture resistance, the high heat deflection temperature, and the heat resistance stability may decrease in some cases. Note that in the case in which a bisphenol A-type epoxy resin is used alone or a mixture of a bisphenol A-type epoxy resin and the above-shown high heat resistance epoxy resin is used as the thermosetting resin base material, it is preferable not to use a curing agent because the heat resistance may be improved in some cases. The ratio of the high heat resistance epoxy resin blended may be, for example, 10% by mass or more and 50% by mass or less, and more preferably 10% or more and 25% by mass or less, when the total mass of the thermosetting resin base material is deemed as 100%. This range is preferable because the heat resistance is improved and also thickening does not occur.

To the thermosetting resin composition, a curing accelerator may be further added as an optional component. As the curing accelerator, imidazole or a derivative thereof, a tertiary amine, a borate ester, a Lewis acid, an organometallic compound, an organic acid metal salt, or the like may be blended as appropriate. The amount of the curing accelerator added is preferably 0.01 parts by mass or more and 50 parts by mass or less, and more preferably 0.1 parts by mass or more and 20 parts by mass or less, relative to 100 parts by mass of the thermosetting resin base material.

The thermosetting resin composition may contain an optional additive as long as the optional additive does not impair the properties. The additive includes, for example, flame retardants, pigments for coloring the resin, plasticizers and silicone elastomer for improving the crack resistance, but is not limited to these. One skilled in the art can determine these optional components and the amounts to be added as appropriate depending on the specifications required for the semiconductor device and/or the sealing material.

Next, a method for manufacturing the semiconductor device according to the present invention will be described. The method for manufacturing the semiconductor device includes the following steps of:

(i) determining the compositions of the first sealing layer and the second sealing layer; and (ii) assembling the semiconductor device.

In step (i), the coefficients of linear expansion $\alpha_1$, $\alpha_2$, the Young's moduli $E_1$, $E_2$, the composite coefficient of linear expansion $\alpha_c$, and the composite Young's modulus $E_c$ of the first sealing layer 21 and the second sealing layer 22 which satisfy the conditions of the above-given formulae (1) to (3) are determined, and optionally, the volume fractions $V_1$ and $V_2$ of the first sealing layer 21 and the second sealing layer 22 are determined. Subsequently, the composition of the thermosetting resin composition, particularly the content of the inorganic filler, that satisfies the coefficient of linear expansion $\alpha_1$, $\alpha_2$ and the Young's moduli $E_1$, $E_2$ of the first sealing layer 21 and the second sealing layer 22, is determined.

In step (ii), the manufacturing of the semiconductor module illustrated will be described. The heat dissipation plate 13, the laminate substrate 12, and the semiconductor element 11 are joined, and the case 16 is attached to the heat dissipation plate 13. Thereafter, the lead frame 18 is joined, and wire bonding with the aluminum wire 14 is conducted. Subsequently, the primer layer 20 is formed. The primer layer 20 may be provided on the entire surface of the sealed members including the semiconductor element 11, the lead frame 18, the laminate substrate 12, the aluminum wire 14, and the case 16 by spray coating or the like, for example. After the primer layer 20 is formed, it is preferable to stepwise conduct heating at 70 to 100° C. for approximately 60 minutes to 80 minutes, and further at 200 to 220° C. for 60 to 80 minutes in an inert oven in which a nitrogen gas has been introduced. This heating operation can heat Cu contained in the lead frame 18 and vaporize the solvent to solidify the primer. Subsequently, the thermosetting resin composition for forming the first sealing layer 21 is injected into the case 16, followed by heat curing (temporary curing) at approximately 90 to 120° C. over 1 to 1.5 hours. Thereafter, the thermosetting resin composition for forming the second sealing layer 22 is injected into the case 16, followed by heat curing (main curing) at 175 to 185° C. for 1 to 2 hours. When the first sealing layer is formed, it is preferable to conduct the temporary curing at a temperature lower than the curing temperature of the sealing resin by 60° C. to 80° C., and thereafter cure the second sealing layer at the curing temperature of the sealing resin (main curing), because this makes it possible to improve the adhesion between the first sealing layer and the second sealing layer. However, the conditions for the heat curing are not limited to specific temperature and time.

According to the semiconductor device of the present invention, it is possible to provide a highly reliable semiconductor device that has reduced occurrence of peeling on the interface between the primer layer and the sealing material even after absorption of moisture and that has such a strength as not to allow cracking to occur. Note that although the lead frame and the sealing material have been described as the structure of the present invention, the same effects are achieved for an electrically conductive plate of a laminate substrate as a sealed member and a sealing material. The present invention exhibits the effects in the case of a structure in which sealed members are formed of Cu or a Cu alloy, Ni or an Ni alloy, or the like, and a primer is formed thereon in contact with a sealing material. However, in particular, since high thermal stress (interface stress) is imparted in the case of a lead frame that is connected to an upper surface of an element and has a bent portion, the application of the present invention to the lead frame portion makes it possible to reduce separation and cracking and thus provide a highly reliable semiconductor device. In addition, since an electrically conductive plate of a laminate substrate, in particular end portions of a first electrically conductive plate undergoes high thermal stress, the present invention is effective also for a first electrically conductive plate that includes end portions.

Note that the configuration of the semiconductor module shown is an example, and the present invention is not limited to this configuration. For example, any desired electrically conductive connection member may be used, or an implant pin may be used. In addition, a configuration in which the electrically conductive connection member is only a lead frame or only a wire is also possible. In a module in which the electrically conductive connection member includes an implant pin, it is possible to form the primer layer on the surface of the implant pin. In a module in which the electrically conductive connection member is only a wire, it is possible to form the primer layer on the surface of the wire.

In addition, a caseless semiconductor module, which does not include a case, can also be employed. Although not shown, the structure of a caseless semiconductor module includes, for example, a structure which includes an implant pin and a printed circuit board joined to the implant pin in place of the lead frame and the aluminum wire in FIG. 1 and in which members including these are sealed with a sealing material. As the printed circuit board, a printed circuit board in which an electrically conductive layer of Cu or Al is formed on a polyimide film substrate or an epoxy film substrate can be used. As the implant pin, a copper pin using copper can be used. The electrically conductive layer of the printed circuit board and the implant pin may be those in which Cu or Al is subjected to a treatment such as Ni plating for the purpose of rust prevention or the like. The printed circuit board and the implant pin electrically connect semiconductor elements to each other or a semiconductor element and a laminate substrate to each other. The implant pin and the laminate substrate or the semiconductor element can be joined by a solder joint layer. In addition, the implant pin can be used as an external connection terminal by drawing the implant pin from the upper surface of the laminate substrate out of the sealing material. The manufacturing of the semiconductor module according to this aspect is as described below. The sealed members including the laminate substrate, the semiconductor element, the implant pin, and the printed circuit board are assembled, the primer layer is formed on the surfaces of the laminate substrate, the semiconductor element, the implant pin, and the printed circuit board by a method such as spray coating, and the sealed members are placed in an appropriate mold and the mold is filled with a first sealing material, followed by the temporary curing. The method for molding such a sealed body includes vacuum injection molding, transfer molding, liquid transfer molding, potting, and the like, but is not limited to certain molding methods. Subsequently, a second sealing material is formed by the same method or by another method such as coating, followed by the main curing. In the case of a caseless semiconductor module as well, by making the caseless semiconductor module include a primer layer and satisfy the conditions of the first sealing layer and the second sealing layer, it is possible to provide a highly reliable semiconductor device that has suppressed interface separation between the primer layer and the sealing material and that does not allow cracking to occur in the sealing material.

Examples

Hereinafter, the present invention will be described in more detail by giving Examples of the present invention. However, the present invention is not limited to the scope of the following Examples.

Reference Examples

For the first sealing layer and the second sealing layer of the present invention, combinations of the contents of the inorganic fillers that satisfy the conditions of the above-described formulae (1) to (3) were calculated. The following combinations are examples of preferable combinations obtained by calculating physical property values in the case in which epoxy resin ME-276 (manufactured by Pelnox Limited) was used as the thermosetting resin base material and a silica having an average particle size of 10 μm (manufactured by AGC Si-Tech Co., Ltd.) was used as the inorganic filler.

In the case in which the first sealing layer and the second sealing layer are formed in approximately the same volume ratio (film thickness ratio) (1:1), when the content of the inorganic filler in the first sealing layer is about 14% by mass to about 41% by mass and the content of the inorganic filler in the second sealing layer is about 68% by mass to about 82% by mass, the conditions of the above-described formulae (1) to (3) are satisfied. In addition, also when the content of the inorganic filler in the first sealing layer is about 41% by mass to about 55% by mass and the content of the inorganic filler in the second sealing layer is about 68% by mass to about 82% by mass, the conditions of the above-described formulae (1) to (3) are satisfied.

For example, in the case in which the first sealing layer and the second sealing layer are formed in a volume ratio (film thickness ratio) of about 1:3, when the content of the inorganic filler in the first sealing layer is about 14% by mass to about 55% by mass and the content of the inorganic filler in the second sealing layer is about 68% by mass or more and less than about 82% by mass, the conditions of the above-described formulae (1) to (3) are satisfied.

For example, in the case in which the first sealing layer and the second sealing layer are formed in a volume ratio (film thickness ratio) of about 3:1, when the content of the inorganic filler in the first sealing layer 21 is about 14% by mass to about 68% by mass and the content of the inorganic filler in the second sealing layer is about 80% by mass or more and less than 84% by mass, the conditions of the above-described formulae (1) to (3) are satisfied. In addition, also when the content of the inorganic filler in the first sealing layer is about 42% by mass to about 55% by mass and the content of the inorganic filler in the second sealing layer is about 68% by mass to less than about 82% by mass, the conditions of the above-described formulae (1) to (3) are satisfied.

Examples (1) Design of Sealing Layers

Thermosetting resin compositions containing an inorganic filler in different contents were prepared, followed by heat curing, and the coefficients of linear thermal expansion and the Young's moduli of the cured products were measured. ME-276 (manufactured by Pelnox Limited) was used as the thermosetting resin base material, and 121% by mass of MV-138 (manufactured by Pelnox Limited) was added to the base material as the acid anhydride-based curing agent. As the inorganic filler, a silica having an average particle size of 10 μm (manufactured by AGC Si-Tech Co., Ltd.) was used. Samples in which the contents of the inorganic filler were 63% by mass, 68% by mass, and 73% by mass relative to the mass of the entire thermosetting resin composition were prepared. These compositions were cured in two stages at 100° C. for 1 hour and at 180° C. for 1 hour to obtain cured products. The coefficient of linear thermal expansion and the Young's modulus were measured for each of the cured products. As the measuring methods, the coefficient of linear expansion was measured by a thermomechanical analysis (TMA method) based on JIS K 7197 and the Young's modulus was measured by a dynamic mechanical analysis (DMA method) based on JIS K 7244-5.

Figure 2:
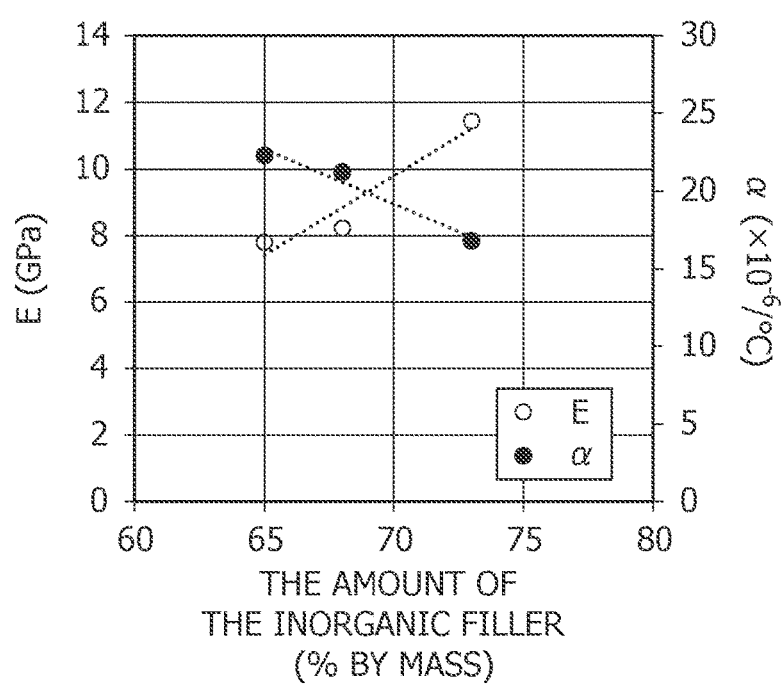
FIG. 2 is a graph showing a result of measuring the coefficient of linear thermal expansion and the Young's modulus of a thermosetting resin composition containing an inorganic filler.

FIG. 2 is a graph showing a relation between the content of the inorganic filler and the coefficient of linear thermal expansion or the Young's modulus for each of these samples. In FIG. 2, an open circle "○" indicates the Young's modulus E and a filled circle "●" indicates the coefficient of linear thermal expansion α. It was confirmed that both of the coefficient of linear thermal expansion α and the Young's modulus E had linear regions that showed linearity relative to the content of the inorganic filler.

(2) Manufacture of Power Modules

In Examples 1 and 2, devices for test of the power module shown in FIG. 1, each having the first sealing layer and the second sealing layer that satisfy the formulae (1) to (3), were fabricated. In Comparative Examples 1 and 2, devices that were the same as that in FIG. 1, except that the devices had only one sealing material were fabricated. Note that the thickness of the single-layer sealing layer formed of one sealing material in Comparative Examples 1 and 2 was made equal to the total thickness of the first sealing layer and the second sealing layer in Examples 1 and 2. In Comparative Example 3, a device in which the first sealing layer and the second sealing layer of Example 2 were stacked in the opposite way was fabricated. Note that in Comparative Example 3 as well, the layer that was in contact with the chip is referred to as a first sealing layer. As the primer layer, HIMAL HL1200F (Hitachi Chemical Co., Ltd.), which contains a polyamide as the main component, was formed in a film thickness of 10 μm on the semiconductor element, the laminate substrate, and the lead frame. In all of the Examples and Comparative Examples, the thermosetting resin base material and the curing agent were the same as those described above, and the same silica was added as the inorganic filler in amounts described in Table 1 described below. In all of Examples 1 and 2 as well as Comparative Example 3, the volume ratio (film thickness ratio) of the first sealing layer and the second sealing layer was set to 1:1. Note that the volume ratio herein is the volume ratio of the sealing material on the upper portion of the semiconductor element.

The coefficient of linear thermal expansion and the Young's modulus of each layer alone in each of Examples and Comparative Examples were obtained in the same experiment as in (1). The composite coefficient of linear thermal expansion and the composite Young's modulus were calculated from the coefficient of linear thermal expansion and the Young's modulus of each layer in accordance with the formulae (2) and (3).

(3) Calculation of Interface Stress

The interface stress between the primer layer and the first sealing layer was calculated based on the Stoney formula. The radius of curvature was obtained from the Young's modulus, the coefficient of linear expansion, and the Poisson ratio as physical property value parameters and the film thickness, the width, and the length as shape parameters, and specifically was calculated on the assumption that the width was 1 mm and the length was 1 mm.

(4) Power-Cycling Test

The power module was subjected to a power-cycling test at 40 to 175° C. under conditions of operation of 2 seconds and pause of 9 seconds as 1 cycle. The judgment was indicated by power-cycling capability "○" in the case in which the cycles until the failure occurred were 100,000 times or more, and by power-cycling capability "x" in the case in which the cycles until the failure occurred were less than 100,000 times. In addition, for cracking, whether cracking occurred in the sealing material after the power-cycling test was visually observed.

The results are shown in Table 1. In Table 1, the coefficient of linear thermal expansion and the Young's modulus of each of Examples 1 and 2 are represented by the signs defined above. In addition, $FC_1$ represents the content of the inorganic filler in the first sealing layer, and $FC_2$ represents the content of the inorganic filler in the second sealing layer. Comparative Examples 1 and 2 were of single layers, and the coefficient of linear thermal expansion, the Young's modulus, and the content of the inorganic filler of each single layer are described in columns $\alpha_1$, FC1, and $E_1$, respectively. In addition, for Comparative Example 3, the coefficient of linear thermal expansion, Young's modulus, content of the inorganic filler of the sealing layer that was in contact with the primer layer are described in columns $\alpha_1$, FC1, and $E_1$, respectively, and the coefficient of linear thermal expansion, Young's modulus, content of the inorganic filler of the sealing layer that was not in contact with the primer layer are described in columns $\alpha_2$, FC2, and $E_2$, respectively.

sion, causing peeling and resulting in a low power-cycling capability (P/C capability). In addition, Comparative Example 2 had the single layer and contained a small amount of the inorganic filler, and although the interface stress was suppressed to be low with a large coefficient of linear expansion, cracking occurred in the sealing material itself because of the small Young's modulus. In addition, although Comparative Example 3 had a structure in which the content of the inorganic filler was large in the lower first sealing layer and the content of the inorganic filler was small in the second sealing material, the interface stress acting on the primer was large, resulting in a low P/C capability. On the other hand, in Examples, the interface stress acting on the primer was small and the rigidity of the module was high, satisfying the P/C capability, making it possible to prevent cracking from occurring.

REFERENCE SYMBOL LIST 11 semiconductor element
12 laminate substrate
121 electrically conductive plate
122 insulating substrate
123a, 123b electrically conductive plate
13 heat dissipation plate
14 aluminum wire
15 external terminal
16 case
17 solder joint layer
18 lead frame
20 primer layer
21 first sealing layer
22 second sealing layer

What is claimed is:
1. A semiconductor device comprising:
a laminate substrate;
a semiconductor element mounted on the laminate substrate;
an electrically conductive connection member;

TABLE 1

| | Example 1 | Example 2 | Comparative Example 1 | Comparative Example 2 | Comparative Example 3 |
|---|---|---|---|---|---|
| $\alpha_2$ [×10$^{-6}$/° C.] | 16.8 | 16.8 | — | — | 22.3 |
| FC2 [wt %] | 73 | 73 | — | — | 65 |
| $E_2$ [GPa] | 11.43828 | 11.43828 | — | — | 7.800121 |
| $\alpha_1$ [×10$^{-6}$/° C.] | 21.2 | 22.3 | 16.8 | 22.3 | 16.8 |
| FC1 [wt %] | 68 | 65 | 73 | 65 | 73 |
| $E_1$ [GPa] | 8.226367 | 7.800121 | 11.43828 | 7.800121 | 11.43828 |
| $\alpha_c$ | 18.64066 | 19.02995 | 16.8 | 22.3 | 19.02995 |
| $E_c$ | 9.832323 | 9.6192 | 11.43828 | 7.800121 | 9.6192 |
| interface stress [MPa] | 8.85 | 8.81 | 9.14 | 8.85 | 9.21 |
| P/C capability | ○ | ○ | x | ○ | x |
| cracking | ○ | ○ | ○ | x | ○ |

It was found from Table 1 that in Comparative Example 1, the sealing layer was a single layer and contained a large amount of the inorganic filler, and although the module had a rigidity with the high Young's modulus, the interface stress was high because of the small coefficient of linear expana sealing material with which the semiconductor element and the electrically conductive connection member are sealed; and
a primer layer on an interface between the sealing material and sealed members including the laminate substrate, the semiconductor element, and the electrically conductive connection member, wherein the sealing material includes: a first sealing layer which is provided in contact with the primer layer; and a second sealing layer which covers the first sealing layer, wherein the semiconductor device satisfies $\alpha_p \geq \alpha_1 > \alpha_2$, wherein $\alpha_p$ represents a coefficient of linear thermal expansion of the primer layer, $\alpha_1$ represents a coefficient of linear thermal expansion of the first sealing layer, and $\alpha_2$ represents a coefficient of linear thermal expansion of the second sealing layer, $\alpha_c \geq 15 \times 10^{-6}/°C.$, wherein $\alpha_c$ represents a composite coefficient of linear thermal expansion of the first sealing layer and the second sealing layer, $E_c \geq 5$ GPa or more, wherein $E_c$ represents a composite Young's modulus of the first sealing layer and the second sealing layer, and $\alpha_c$ and $E_c$ are defined by the following formulae:

$\alpha_c = (\alpha_1 E_1 V_1 + \alpha_2 E_2(1-V_1))/(E_1 V_1 + E_2(1-V_1))$, and $E_c = E_1 V_1 + E_2(1-V_1)$, wherein $E_1$ represents a Young's modulus of the first sealing layer, $E_2$ represents a Young's modulus of the second sealing layer, and $V_1$ represents a volume fraction of the first sealing layer in a total volume of a sealing material portion stacked on a predetermined interface region including the primer layer ($0<V_1<1$).

2. The semiconductor device according to claim 1, wherein
the coefficient of linear thermal expansion $\alpha_1$ of the first sealing layer and the coefficient of linear thermal expansion $\alpha_2$ of the second sealing layer satisfy $100 \geq \alpha_1 > \alpha_2 \geq 10$.

3. The semiconductor device according to claim 1, wherein
$V_1$ is 0.4 to 0.8 in a sealing material portion stacked on an interface region on an upper portion of the semiconductor element.

4. The semiconductor device according to claim 1, wherein the first sealing layer contains a thermosetting resin base material and an inorganic filler, the second sealing layer contains a thermosetting resin base material and an inorganic filler, and a content of the inorganic filler in the first sealing layer is smaller than a content of the inorganic filler in the second sealing layer.

5. The semiconductor device according to claim 4, wherein
the content of the inorganic filler in the first sealing layer is selected from a range of 14 to 68% by mass, and the content of the inorganic filler in the second sealing layer is selected from a range of 68 to 85% by mass.

6. The semiconductor device according to claim 3, wherein the thermosetting resin base material contained in the first sealing layer and the thermosetting resin base material contained in the second sealing layer are each an epoxy resin.

7. The semiconductor device according to claim 3, wherein the first sealing layer and/or the second sealing layer further contain a curing agent, and the curing agent is an acid anhydride-based curing agent.

8. The semiconductor device according to claim 1, wherein the primer layer is selected from a polyamide resin, a polyimide resin, and a polyamide-imide resin.

* * * * *